United States Patent [19]

White, Jr. et al.

[11] 4,255,679
[45] Mar. 10, 1981

[54] DEPLETION LOAD DYNAMIC SENSE AMPLIFIER FOR MOS RANDOM ACCESS MEMORY

[75] Inventors: Lionel S. White, Jr., Houston, Tex.; James C. Blankenhorn, Phoenix, Ariz.

[73] Assignee: Texas Instruments Incorporated, Dallas, Tex.

[21] Appl. No.: 955,675

[22] Filed: Oct. 30, 1978

[51] Int. Cl.³ .......................... H03K 5/24; G11C 7/06
[52] U.S. Cl. ..................................... 307/355; 307/362; 307/DIG. 3; 365/203; 365/205
[58] Field of Search .............. 307/279, 291, 355, 356, 307/362, DIG. 3; 365/190, 196, 202, 203, 205, 207, 208

[56] References Cited

U.S. PATENT DOCUMENTS

| | | | |
|---|---|---|---|
| 3,953,839 | 4/1976 | Dennison et al. | 307/DIG. 3 X |
| 3,959,781 | 5/1976 | Mehta et al. | 307/DIG. 4 X |
| 4,003,034 | 1/1977 | Au | 307/DIG. 3 X |
| 4,028,557 | 6/1977 | Wilson | 307/362 |
| 4,050,061 | 9/1977 | Kitagawa | 307/DIG. 3 X |
| 4,070,590 | 1/1978 | Ieda et al. | 365/205 X |
| 4,081,701 | 3/1978 | White, Jr. et al. | 307/355 |
| 4,119,870 | 10/1978 | Zibert | 307/DIG. 3 X |
| 4,138,740 | 2/1979 | Itoh | 365/205 X |
| 4,144,590 | 3/1979 | Kitagawa et al. | 365/205 |

OTHER PUBLICATIONS

Gray, "Bit Line Restore Shorting Technique", *IBM Tech. Discl. Bull.*, vol. 20, No. 5, pp. 1714–1715, 10/1977.
Schuster, "High Performance Sense Amplifier Circuit", *IBM Tech. Discl. Bull.*, vol. 21, No. 2, pp. 882–883, 7/1978.
Stein et al., *IEEE-JSSC*, vol. SC-7, No. 5, pp. 336–340, 10/1972.
Kuo et al., *Electronics* (Pub.), pp. 81–86, 5/13/76.

*Primary Examiner*—Larry N. Anagnos
*Attorney, Agent, or Firm*—John G. Graham

[57] ABSTRACT

A random access memory device of the MOS integrated circuit type employs an array of rows and columns of one-transistor storage cells with a bistable sense amplifier circuit of the dynamic type at the center of each column. A dummy cell is connected to each column line half and is addressed when a memory cell on the opposite side of the sense amplifier is addressed by one of the row lines. A coupling transistor connects each column line half to one of the cross-coupled driver transistors of the bistable circuit. The coupling transistors are of the depletion mode type and each has its gate connected to the sense node on the opposite side between the other coupling transistor and driver transistor.

10 Claims, 12 Drawing Figures

DEPLETION LOAD DYNAMIC SENSE AMPLIFIER FOR MOS RANDOM ACCESS MEMORY

BACKGROUND OF THE INVENTION

This invention relates to semiconductor memory devices, and more particularly to an improved sense amplifier for an N-channel MOS memory device of the type employing one-transistor memory cells.

MOS random access memory (RAM) devices, widely used in the manufacture of digital equipment such as minicomputers, continue to offer increased speed capabilities and cost advantages. The cost per bit of storage using MOS RAMs goes down as the number of bits or memory cells per package goes up. Successively larger RAMs have been standards in the industry. A RAM containing 4096 bits, for example, is shown in U.S. Pat. NO. 3,940,747 issued Feb. 24, 1976 to Kuo and Kitagawa, assigned to Texas Instruments, while 16,384 bit or "16K" RAMs are described in U.S. Pat. Nos. 4,050,061 and 4,081,701, assigned to Texas Instruments, and in articles in *Electronics*, Feb. 19, 1976, pp. 116–121, and May 13, 1976, pp. 81–86.

As the number of bits in a semiconductor chip is increased, the cell size decreases, and the magnitude of the storage capacitor in each cell of necessity decreases. Also, the number of cells on a digit line in the array of cells increases, so the capacitance of this line increases, and the ratio of the storage capacitance to that of the digit line decreases. These factors increase the difficulty in sensing the data signal which exists on a digit line. A full logic level difference between a "1" and a "0" in one of these devices may be perhaps 5 volts; however, the difference in voltage between a "1" and a "0" for the data coupled to a column line and reaching the sense amplifier in the center of the memory array from the selected one-transistor cell and dummy cell may be only fifty millivolts or less. Various circuits for sensing these low-level signals have been used. Memory cell layouts with sense amplifiers in the center of each column line are shown in U.S. Pat. No. 3,940,747, and the *Electronics* articles mentioned above, and in U.S. Pat. No. 3,838,404 to Heeren, as well as in *Electronics*, Sept. 13, 1973, Vol. 46, No. 19, pp. 116–121, and *IEEE Journal of Solid State Circuits*, Oct. 1972, p. 336, by Stein et al. One of the most widely used sense amplifiers for MOS RAMs at present is the dynamic type used in the 16K and 64K devices manufactured by several companies as part numbers 4027 and 4116. However, these circuits require additional clock voltages for the series transistors between the sense nodes and the bistable transistors and also are of complicated layout.

It is a principal object of this invention to provide an improved sense amplifier for an MOS RAM, and in particular a circuit which is of high speed operation as well as high sensitivity, and which is of small size in layout and simplified in construction.

BRIEF SUMMARY OF THE INVENTION

In accordance with one embodiment of the invention, a random access memory device of the MOS integrated circuit type employs an array of rows and columns of one-transistor storage cells with a bistable sense amplifier circuit of the dynamic type at the center of each column. A dummy cell is connected to each column line half and is addressed when a memory cell on the opposite side of the sense amplifier is addressed by one of the row lines. A coupling transistor connects each column line half to one of the cross-coupled driver transistors of the bistable circuit. According to the primary feature of the invention, the coupling transistors are of the depletion mode type and each has its gate connected to a sense node on the opposite side between the other coupling transistor and driver transistor. No extra clock and clock bus are needed, so smaller size is obtained. The coupling transistor also functions as a sensing transistor.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
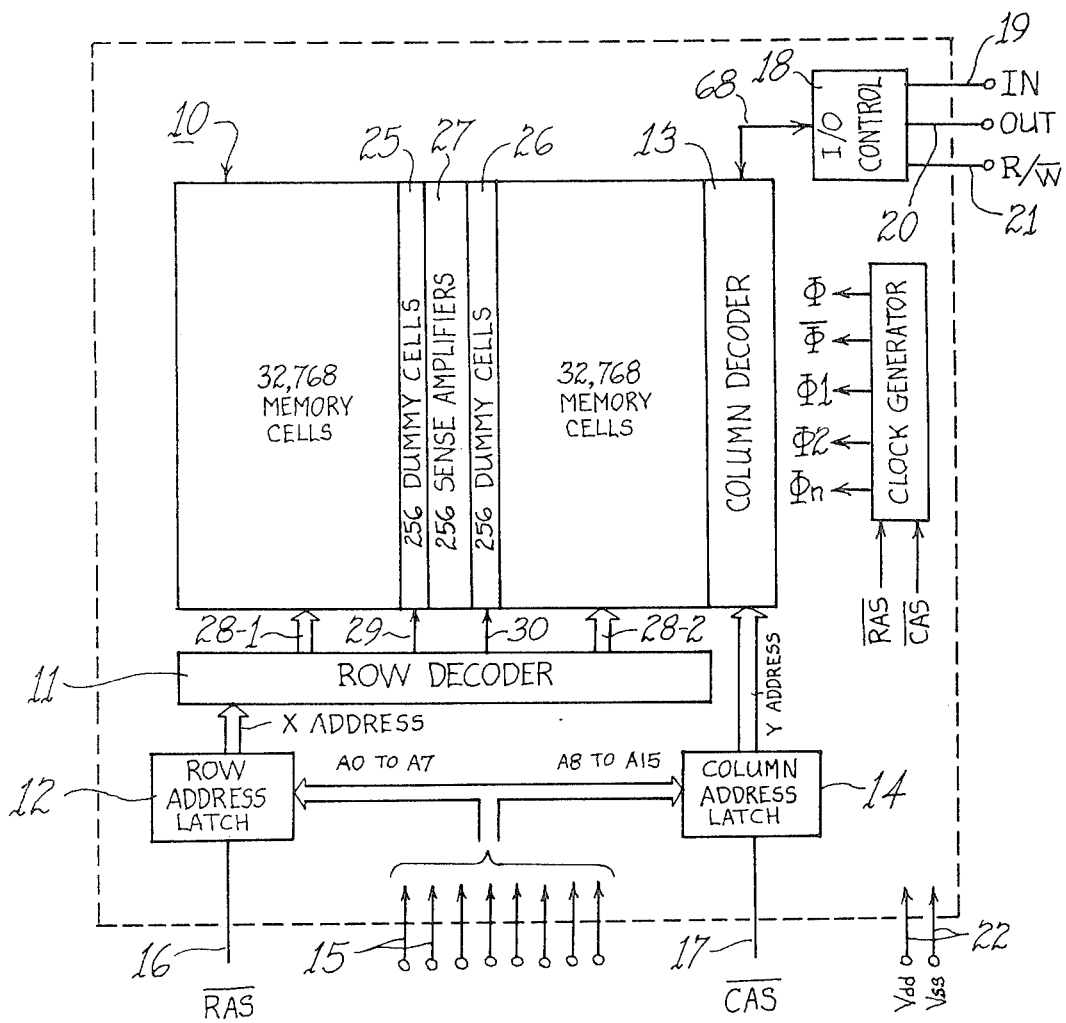
FIG. 1 is a block diagram of a semiconductor memory device which may utilize the sense amplifiers of the invention.

A memory device which may use the invention is shown in FIG. 1. The concept of the invention is particularly useful in very high density memory devices containing, for example, 65536 or 261824 cells on one silicon chip of about 1/10 to 1/20 square inch. This type of device may be made by an N-channel silicon-gate self-aligned MOS process which is described in U.S. Patent Applications Ser. No. 648,594, filed Jan. 12, 1976, or Ser. No. 722,841, filed Sept. 13, 1976 by C-K Kuo, both assigned to Texas Instruments. The device in this illustration consists of an array 10 of 65536 memory cells generally divided into 256 rows and 256 columns; each cell is a so-called one-transistor cell of the type shown in said applications Ser. No. 648,594, or Ser. No. 722,841. A row decoder 11 selects one of the 256 row lines as determined by a row or X address contained in an eight-bit row address buffer or latch 12; likewise a column decoder 13 selects one of the 256 column lines as determined by a column or Y address contained in an eight-bit column address buffer or latch 14. These addresses are applied to the chip by eight address lines 15, on a time-share basis or multiplexed. When an $\overline{RAS}$ or row address strobe input 16 (seen in FIG. 3a) is at logic "0" or zero volts, the row address buffers 12 are enabled to accept a row address from the lines 15. The row address includes address bits A0 to A7. In like manner a $\overline{CAS}$ or column address strobe input 17 (seen in FIG. 3b) when at logic "0" or zero volts enables the column address buffer 14 to accept a column address (bits A8 to A15) from the lines 15. The row and column addresses must be valid on the pins 15 during the time periods shown in FIG. 3c. Sixteen address bits are needed to uniquely define one bit of 65536 cells ($2^{16} = 65,536$). Input/output control circuitry 18 is connected to the array 10 via column decoder 13, and functions to apply data to the column lines from a data input pin 19, or to detect data on the column lines and apply it to a data output pin 20, under control of a read/write R/$\overline{W}$ input 21 as well as under control of various internally generated clock and logic voltages. Alternatively, a single bidirectional I/O port may be used in place of the separate input and output ports 19 and 20. The device requires supply voltages on pins 22; these may include Vdd and Vbb supply voltages as well as ground or Vss. Of course, some circuits are designed to operate on one or three supply voltages rather than two. Rows of dummy cells 25 and 26 are positioned in the cell on each column line half. According to the invention, each of the 256 column lines has one of a set of 256 identical sense amplifiers 27 as described below positioned in its center. The decoder 11, of conventional design, functions to select one out of the 128 row lines 28-1 on the left side or one of the 128 row lines 28-2 on the right side. A row line is a metal line which extends along most of the width of the chip and drives the polysilicon gates of 256 MOS transistors in the 256 memory cells associated with this row. The eight address bits A0 to A7 in the row decoder 11 select one row line out of 256 to go high, the other 255 remaining low. The row address voltage (referred to as X in FIG. 3e) exists on the one selected line 28-1 or 28-2 during the time beginning just after $\overline{RAS}$ goes low and triggered by $\overline{RAS}$. Address bit A7 selects either left or right side, i.e., permits activation of either one of lines 28-1 or one of lines 28-2. Then the seven bits of A0 to A6 will select one of the 128 lines in the selected half. A7 will also determine activation of dummy cells 25 or 26 in the unselected side via dummy cell address lines 29 or 30, during $\overline{RAS}$, as is conventional. If the most significant bit of the X address is a 0, the selected row of memory cells will be in the right hand side 28-2, so the dummy cells 25 in the left side will be activated, and vice versa.

Figure 3:
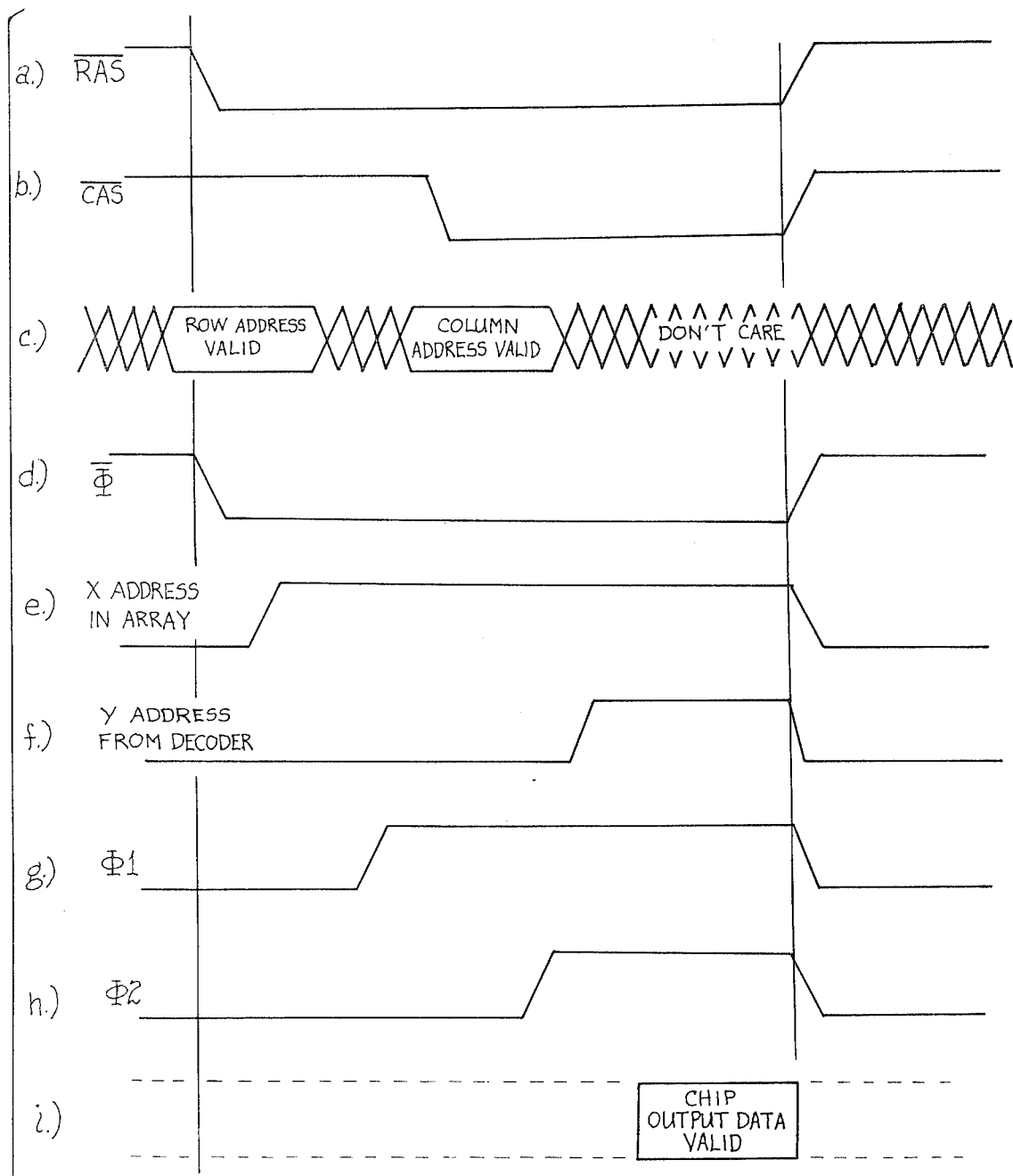
FIG. 3a–3i are graphic representations of voltages appearing at various points in the system of the invention, plotted as a function of time.

The sense amplifiers 27 are for the purpose of detecting the low level signal created on the selected column line when a cell is addressed and converting this low level signal to a full logic level. The sense amplifiers 27 as well as the decoders 11 and 13, the address latches 12 and 14 and the I/O control 18 utilize a number of clock voltages such as $\Phi$, $\overline{\Phi}$, $\Phi1$ and $\Phi2$ as seen in FIG. 3. These clock voltages, initiated and timed from $\overline{RAS}$, are produced by a conventional clock generator.

Figure 2:
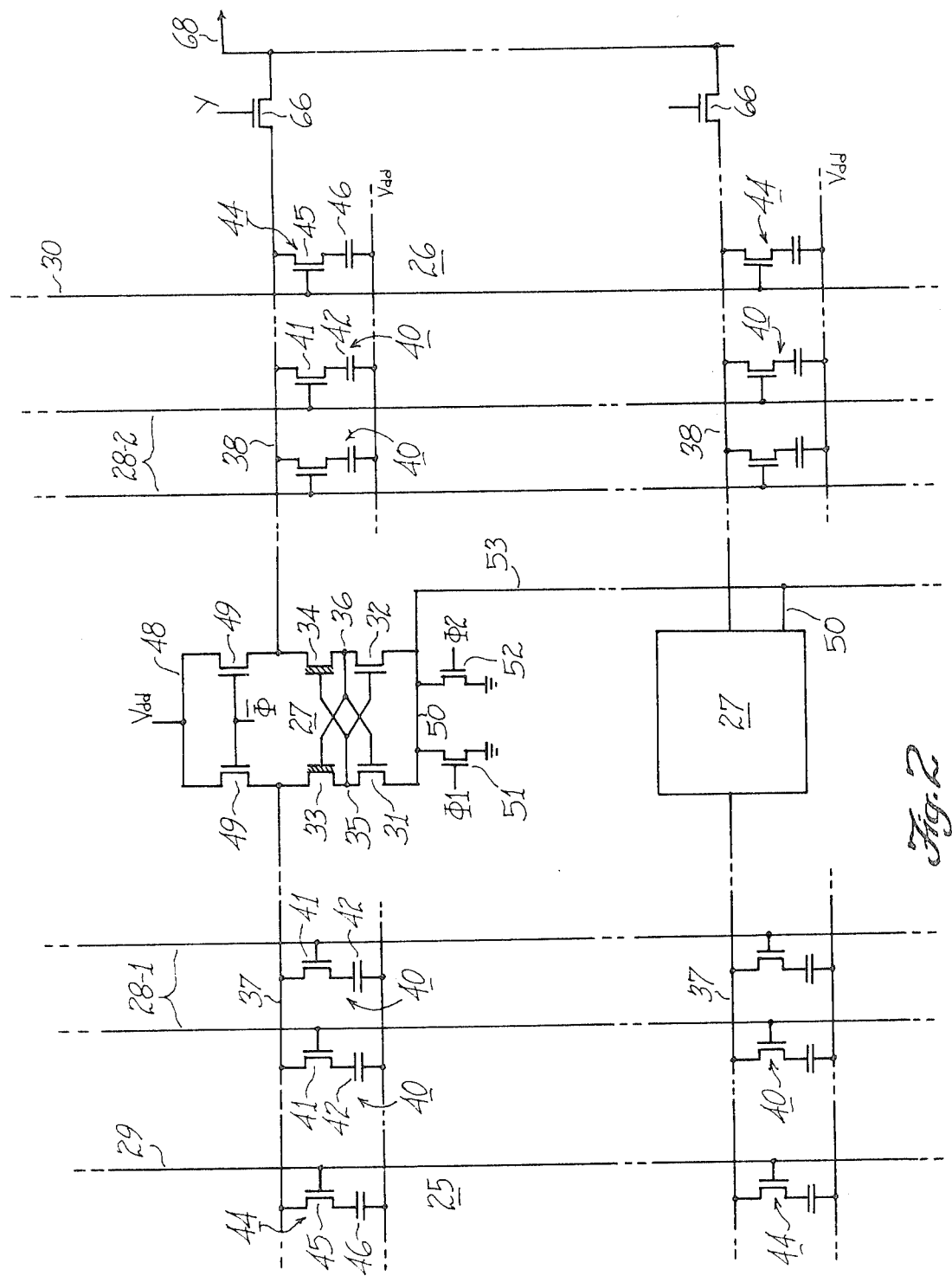
FIG. 2 is an electrical schematic diagram of an array of memory cells for the system of FIG. 1, employing the sense amplifiers of the invention.

Referring to FIG. 2, a memory array using a sense amplifier according to the invention is illustrated. Each sense amplifier 27 consists of a flip-flop or bistable circuit having two cross-coupled driver transistors 31 and 32 along with associated series-connected depletion transistors 33 and 34. A pair of nodes 35 and 36 are connected to the respective halves 37 and 38 of the column line through the depletion transistors. These nodes 35 and 36 are connected to the gates of the opposite transistors 31 and 32 to provide the cross-coupled arrangement of a bistable circuit.

The line 37, half of a column line, has 128 cells 40 connected to it, and so does the line 38. Each cell consists of a transistor 41 and a capacitor 42; the gate of each transistor 41 is controlled by a row line 28-1 or 28-2, and each row line is connected to 256 gates for like transistors 41. In the array 10 of this embodiment, there are 128 row lines on each side of the sense amplifiers 27, and, of course, there are 256 sense amplifiers 27, so only a very small part of the array 10 is seen in FIG. 2. Each sense amplifier 27 has two dummy cells 44, one on each side, connected to the column lines 37 and 38. The dummy cells are like the storage cells 40, and each includes a transistor 45 and a capacitor 46. Lines 29 and 30 function to turn on the transistor 45 in the row of dummy cells on the opposite side of the sense amplifier from the selected cell 40 as defined by bit A7 of the row address, at the same time the selected storage cell 40 is addressed.

In the sense amplifiers, each column line 37 or 38 is connected to a supply voltage line 48 through a transistor 49, with the gates of these transistors being driven by $\overline{\Phi}$; this functions to charge the lines 37 and 38 equally to a voltage level of about Vdd. Since the transistors 33 and 34 are depletion devices, the nodes 35 and 36 will also be charged to Vdd. The flip-flop circuit including the transistors 31 and 32 begins to function when a node 50 connected to the drains of the transistors is coupled to ground. As disclosed in U.S. Pat. Nos. 4,050,061, or 4,081,701, the node 50 is grounded through separate paths including in this case two transistors 51 and 52 controlled by clocks $\Phi1$ and $\Phi2$. The transistors 51 and 52 are of different sizes so the amount of current drawn by these transistors from the node 50 to Vss or ground is different. Transistor 51 is the smallest and transistor 52 is about twice its size, measured in device ratio or width to length of the channel. All 256 of the sense amplifiers 27 in the array 10 share the same pair of transistors 51 and 52; a line 53 connects together the nodes 50 of all these sense amplifiers. When a clock $\Phi1$ (seen in FIG. 3g) goes positive, a sense operation is initiated, and the flip-flop will tend to go toward a stable condition where either transistor 31 is conductive and transistor 32 is cut off, or vice versa. The direction of switching will depend upon the voltage difference between lines 37 and 38 which depends upon whether a one or zero was stored in the selected cell 40. One of the lines 37 or 38 will be at a slightly higher voltage than the other, and when $\Phi1$ goes positive one of the transistors 31 or 32 will tend to conduct slightly more current than the other.

Figure 4:
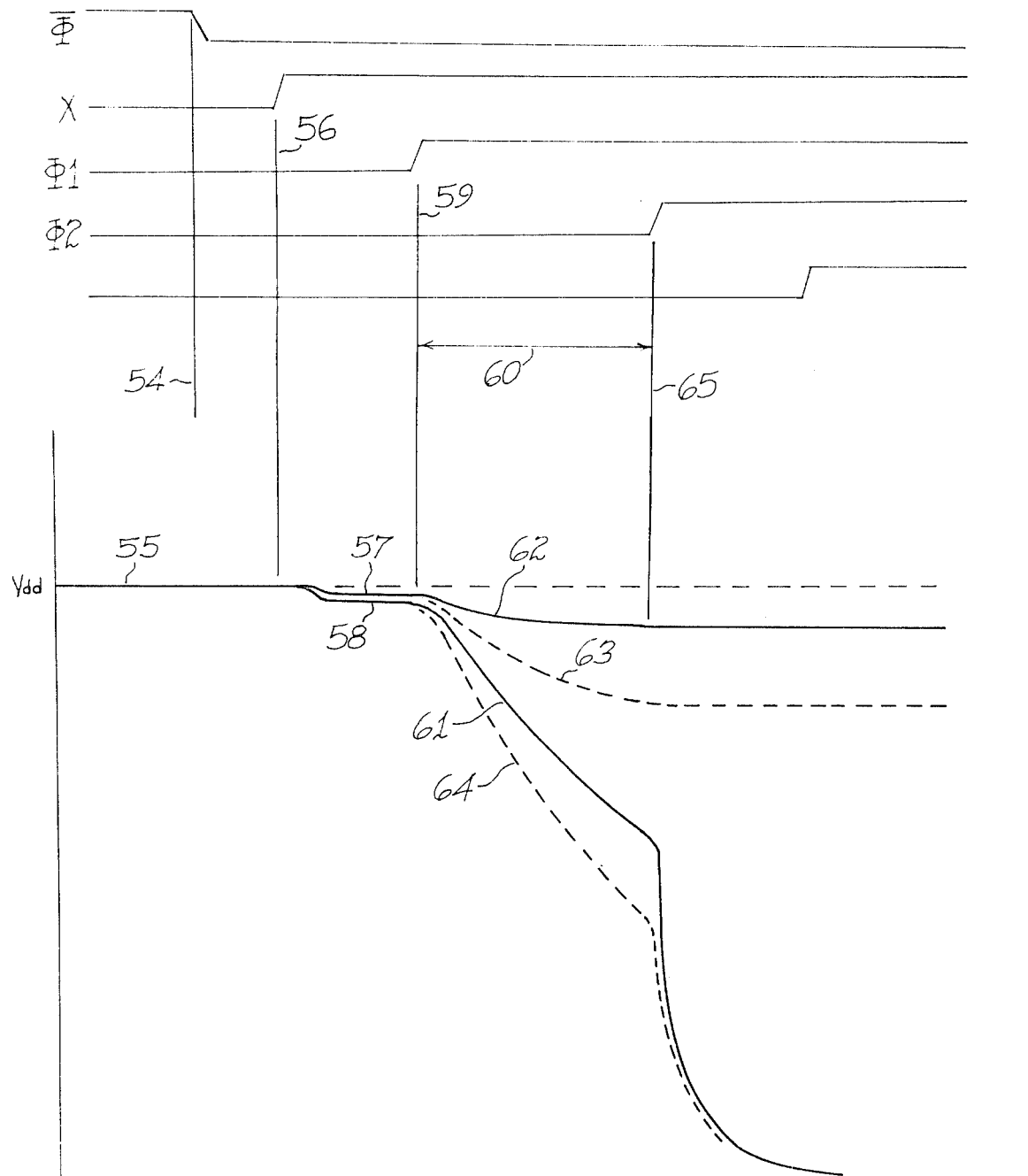
FIG. 4 is a detailed graphic representation of voltage vs. time for the digit lines in the circuit of FIG. 2.

Referring to FIG. 4, the voltage on the digit lines 37 and 38 is shown in enlarged view as a function of time during a sense operation. Prior to a time 54, $\overline{\Phi}$ is on and the lines 37 and 38 are charged to a level 55. This is before the address actuates one of the row lines 28-1 or 28-2 and one of the dummy cell address lines 29 or 30, and before $\Phi1$ goes high. At a time 56, one of the lines 28-1 or 28-2 goes high, and one of the dummy cells is addressed by the lines 29 or 30 and the voltages on the lines 37 and 38 separate very slightly as seen by lines 57 and 58, perhaps 50 millivolts, due to one of the storage capacitors 42 being connected to one side and a dummy cell capacitor 46 (smaller than 42) being connected to the other.

At time 59, $\Phi1$ goes high and one of the lines 37 or 38 begins to discharge toward a "0" level and continues during an interval 60, as seen in line 61. The other of the digit lines 37 or 38 discharges only slightly, not over about one volt, as seen by a line 62. According to an important feature of the invention, the voltages on the nodes 35 and 36 separate much more quickly than the voltages on the digit lines 37 and 38. This is because the driver transistors 31 and 32 are much larger in size than the depletion transistors 33 and 34. Thus the digit line which is to remain high is not discharged. The voltages on the nodes 35 and 36 are shown in FIG. 4 as the dotted lines 63 and 64. In the time interval 60, prior to the time 65 when $\Phi2$ comes on, if a "1" was stored the transistor 31 or 32 opposite the selected cell will conduct more than the one opposite the dummy cell. If an "0" is stored, the reverse is true.

The depletion transistors 33 and 34 serve both as load devices for the sensing nodes 35 and 36, as well as sensing devices themselves. The gates of these transistors 33 and 34 are connected to the opposite sensing nodes 35 and 36, so the depletion transistors serve a sensing function. Thus, as the zero-going one of the nodes 35 and 36 goes lower in voltage, it will tend to reduce conduction of the opposite transistor 33 or 34 on the one-going side, so this isolates the line 37 or 38 and holds the one-going side higher. In turn, the higher voltage on the one-going node 35 or 36 tends to drive the depletion transistor 33 or 34 further into conduction, speeding up the voltage separation.

At some point during the time period 60, or at least at time 65 when Φ2 goes high, the driver transistor 31 or 32 for the one-going side will be completely cut off, so the voltages 62 and 63 will not decay further. The zero-going side will be driven toward Vss at a higher rate when Φ2 goes high at time 65 since the larger transistor 52 comes on, exhibiting the steeper drop in the voltages 61 and 64 seen in FIG. 4.

Layout of the sense amplifier 27 is simplified, compared to prior designs where a separate clock was used to drive the gates of transistors 33 and 34, because no extra clock bus is needed. Also the transistors 31 and 33 use the same polysilicon segment to form their gates since these gates are electrically connected together. The same applies to the gates of the transistors 32 and 34.

After sensing is complete, one of the lines 37 or 38 will be at a logic 1 level and the other at Vss or logic 0. Then as a Y select voltage of FIGS. 3f or 4 turns on one of the transistors 66 at time 67, a full logic level will be applied to the I/O circuitry 18 in line 68. Data output is valid as seen in FIG. 3i.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. In a memory system of the type having array of rows and columns of memory cells, a sense amplifier positioned at the center of each column line, each sense amplifier including a pair of cross-coupled driver transistors and a coupling transistor in series with each driver transistor between the driver transistor and the column line, and a precharge device connected to each half of each column line, each precharge device functioning to precharge the column line to approximately a supply voltage level, the improvement wherein each of said coupling transistors is of the depletion mode type.

2. Apparatus according to claim 1 wherein the driver transistors and the coupling transistors are insulated gate field effect transistors having a source-to-drain path and a gate, and the source-to-drain path of each coupling transistor is in series with the source-to-drain path of a driver transistor.

3. Apparatus according to claim 2 wherein the source-to-drain path of each coupling transistor is connected to the source-to-drain path of a driver transistor at a sense node.

4. Apparatus according to claim 3 wherein the gate of each coupling transistor is connected to the gate of the driver transistor that is in series with such coupling transistor.

5. Apparatus according to claim 4 wherein the gate of each driver transistor is cross-coupled to the sense node for the other driver transistor.

6. Apparatus according to claim 5 wherein each said coupling transistor functions also as a sensing transistor.

7. A sense amplifier for a semiconductor memory of the type having balanced digit lines with a sense amplifier in the center of each digit line, comprising: a pair of cross-coupled driver transistors providing a bistable circuit; a pair of coupling transistors each connecting one of the driver transistors to one side of a digit line; each of the driver transistors and each of the coupling transistors being a field effect transistor with a source-to-drain path and a gate, the source-to-drain path of each driver transistor being connected at a sense node to the source-to-drain path of one of the coupling transistors; precharge means connected to each digit line functioning to precharge both sides of each digit line to approximately a supply voltage level; each of the coupling transistors being a depletion node device and the gate of each coupling transistor being connected to the sense node for the other coupling transistor.

8. A sense amplifier according to claim 7 wherein the memory is an array of rows and columns of memory cells of the one-transistor type, each column being a balanced digit line, with a dummy cell of the one-transistor type connected to each side of a digit line.

9. A sense amplifier according to claim 7 wherein a pair of grounding transistors having parallel source to drain paths is connected to the ends of the source-to-drain paths opposite the sense node for each pair of driver transistors, the grounding transistors being of different sizes and being turned on at different times in an operating cycle.

10. A sense amplifier according to claim 9 wherein the coupling transistors function as sensing transistors during the time period between when one of the grounding transistors is turned on and when the other grounding transistor is turned on.

* * * * *

UNITED STATES PATENT OFFICE
CERTIFICATE OF CORRECTION

Patent No. 4,255,679  Dated March 10, 1981

Inventor(s) Lionel S. White, Jr. and James C. Blankenhorn

It is certified that error appears in the above-identified patent and that said Letters Patent are hereby corrected as shown below:

Column 6, line 37, "node" has been changed to --mode--.

Signed and Sealed this

Fifteenth Day of December 1981

[SEAL]

Attest:

GERALD J. MOSSINGHOFF

Attesting Officer   Commissioner of Patents and Trademarks